(12) United States Patent
Nakamura et al.

(10) Patent No.: US 6,539,537 B1
(45) Date of Patent: Mar. 25, 2003

(54) SYSTEM SYNTHESIZER

(75) Inventors: Atsushi Nakamura, Tokyo (JP);
Kazutoshi Wakabayashi, Tokyo (JP);
Yuichi Maruyama, Kanagawa (JP)

(73) Assignee: NEC Corporation, Tokyo (JP)

( * ) Notice: Subject to any disclaimer, the term of this patent is extended or adjusted under 35 U.S.C. 154(b) by 145 days.

(21) Appl. No.: 09/660,470

(22) Filed: Sep. 12, 2000

(30) Foreign Application Priority Data

Sep. 13, 1999 (JP) .......................................... 11-259518

(51) Int. Cl.$^7$ ............................................... G06F 17/50
(52) U.S. Cl. ................................ 716/18; 716/1; 716/3; 716/6
(58) Field of Search ............................ 716/1, 3, 6, 18; 717/109, 155

(56) References Cited

U.S. PATENT DOCUMENTS 5,864,487 A * 1/1999 Merryman et al. ............ 716/6

* cited by examiner

Primary Examiner—Vuthe Siek
Assistant Examiner—Naum Levin
(74) Attorney, Agent, or Firm—Foley & Lardner

(57) ABSTRACT

The system synthesizer of the present invention is provided for synthesizing a system containing from a system description, the system description containing a permanent connection statement describing an access from a first circuit to a memory element in an interface circuit, and a behavioral sequential operation statement describing the operation of a second circuit which contains an access from the second circuit to the memory element in the interface circuit. The system synthesizer comprises: a separator for separating the permanent connection statement from the behavioral sequential operation statement; a determining processing unit for determining whether a variable in the system description is ans interface variable indicating the memory element in the interface circuit; an interface circuit synthesizer for synthesizing the interface circuit from the permanent connection statement separated by the separator; a behavior synthesizer for synthesizing a sequential operation circuit from the behavioral sequential operation statement separated by the separator; a merging processing unit for merging the interface circuit with the sequential operation circuit via the memory element indicated by the interface variable; and a mergence result output device for outputting the system produced by the merging processing unit in a hardware description language.

9 Claims, 17 Drawing Sheets

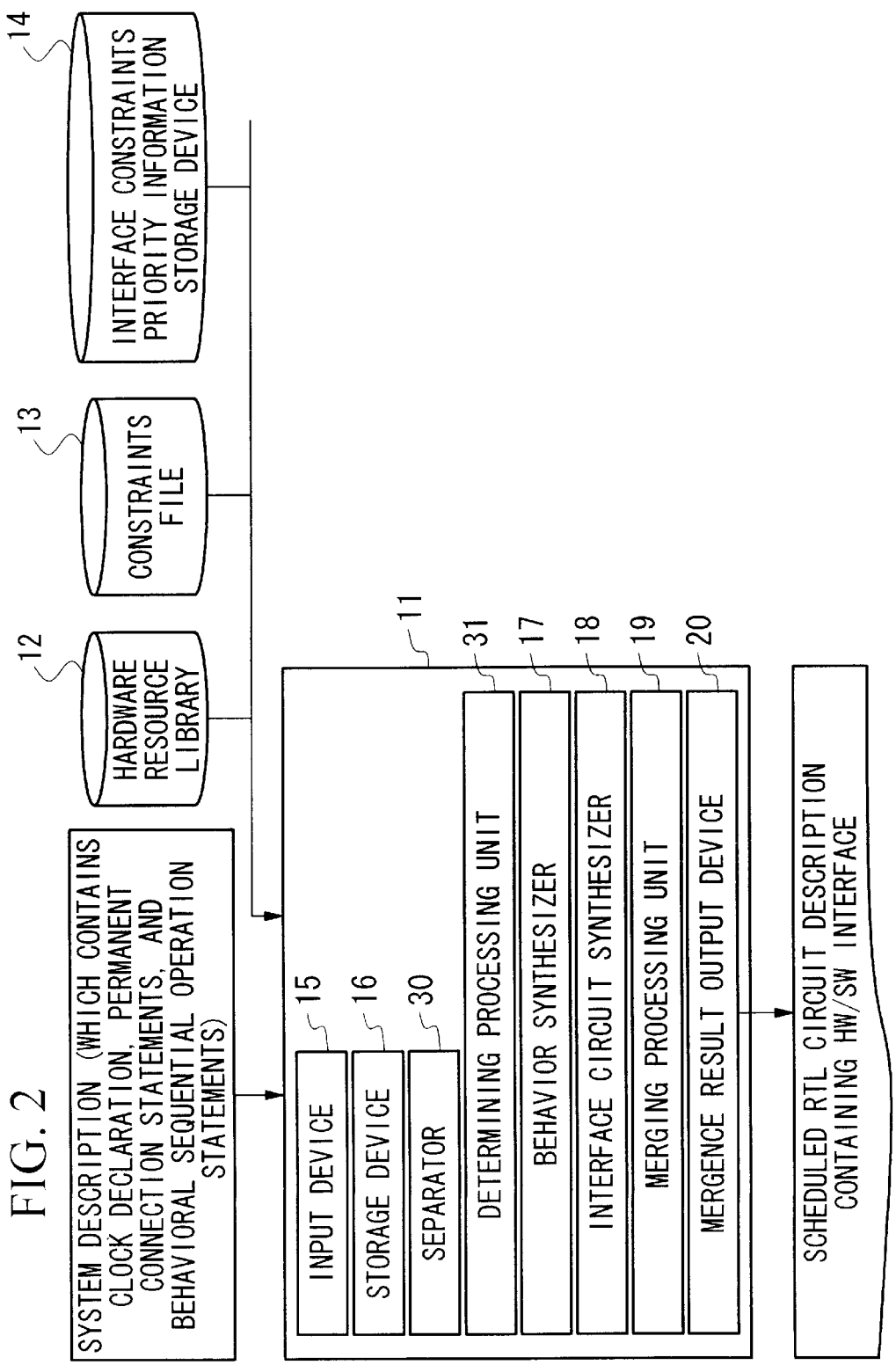

FIG. 3

STEP 1
INPUT DEVICE READS SYSTEM DESCRIPTION AND STORES IT IN STORAGE DEVICE (SYSTEM DESCRIPTION CONTAINS CLOCK DECLARATION, PERMANENT CONNECTION STATEMENTS, AND BEHAVIORAL SEQUENTIAL OPERATION STATEMENTS)

STEP 2
IINPUT DEVICE READS HARDWARE RESOURCE LIBRARY AND STORES IT IN STORAGE DEVICE

STEP 3
INPUT DEVICE READS CONSTRAINTS FILE FOR SYNTHESIZING OPERATIONS AND STORES IT IN STORAGE DEVICE

STEP 4
BEHAVIOR SYNTHESIZER SYNTHESIZES BEHAVIORAL SEQUENTIAL OPERATION CIRCUIT FROM BEHAVIORAL SEQUENTIAL OPERATION STATEMENTS STORED IN STORAGE DEVICE, USING HARDWARE RESOURCE LIBRARY AND CONSTRAINTS FILE, AND STORES RESULTS IN STORAGE DEVICE

STEP 5
INPUT DEVICE READS INTERFACE CONSTRAINTS PRIORITY INFORMATION, AND STORES IT IN STORAGE DEVICE

STEP 6
SYNTHESIZE INTERFACE CIRCUIT FROM PERMANENT CONNECTION STATEMENTS STORED IN STORAGE DEVICE, MERGE IT WITH SEQUENTIAL OPERATION CIRCUIT, BASED ON INTERFACE CONSTRAINTS PRIORITY, AND STORE RESULTS IN STORAGE DEVICE

STEP 7
OUTPUT MERGENCE RESULT (SCHEDULED RTL CIRCUIT CONTAINING HW/SW INTERFACE), STORED IN STORAGE DEVICE, IN HDL SUCH AS VHDL AND VERILOG HDL

FIG. 7A

```
{ in clock : 100MHz ; /*slave clock*/
  in ext_clock : 66MHz ; /*CPU bus clock (outside slave)*/
```

FIG. 7B

```
{ in clock : 10KHz,100MHz ;
  in ext_clock : 33MHz,66MHz;
```

FIG. 8

```
 process example( )
{
 /*permanent connection statement*/
 a_reg::=nmux{
     when((address==0xFC00)&&write) write_data_from_bus;
 };

read_data_to_bus::nmux{
     when((address==0xFC00)&&read)  a_reg;
 };

/*behavioral sequential operation statement*/
 wait clock;
 wait clock;
 wait clock;
 if(condition 1)
     a_reg=write_data_from_slave;
 wait clock;
 wait clock;
 wait clock;
 wait clock;
 if(a_reg==5) {
 wait clock;
 wait clock;
 wait clock;
 }
 wait clock;
 wait clock;
}
```

```
  process example( )
{
/* permanent connection text */
  b_mem[address-offset]::=nmux{                                            ⎫ 34a
    when(address>=0xFC01&&address<=0xFC11&&write) write_data_from_bus;    ⎬
  };                                                                       ⎭
                                                                               ⎫
  read_data_to_bus::nmux{                                                  ⎫  ⎬ 34
    when(address>=0xFC01&&address<=0xFC11&&read)b_mem[address-offset];    ⎬ 34b
  };                                                                       ⎭
                                                                          ⎫
/* sequential operation text*/                                            ⎪
  wait clock;      ⎫                                                      ⎪
  wait clock;      ⎬ 35a                                                  ⎪
  wait clock;      ⎭                                                      ⎪
  if(condition 1)                                                         ⎪
     b_mem[3]=write_data_from_slave;  ⎬ 35b                               ⎪
  wait clock;      ⎫                                                      ⎬ 35
  wait clock;      ⎬ 35c                                                  ⎪
                                                                          ⎪
  if(b_mem[2]==5) {  ⎫                                                    ⎪
     wait clock;     ⎬ 35d                                                ⎪
  }                  ⎭                                                    ⎪
  wait clock;      ⎫                                                      ⎪
  wait clock;      ⎬ 35e                                                  ⎪
}                  ⎭                                                      ⎭
```

SYSTEM SYNTHESIZER

BACKGROUND OF THE INVENTION

1. Field of the Invention

The present invention relates to a system synthesizer for synthesizing a circuit for performing specified behavioral operations, from a description of the behavioral operations written in a specified language, and for outputting the circuit in a specified hardware description language.

This application is based on Japanese Patent Application No. Hei 11-259518, the contents of which are incorporated herein by reference.

2. Description of the Related Art

Recently, the scales of ICs increased, and structures have become complicated. To develop an IC, a method for automatically synthesizing a circuit using various tools is employed. The general process for developing an IC using various tools is explained with reference to FIG. 18. A developer makes a circuit specification (S101). Next, data describing behavioral operations in a specified language is produced based on the circuit specification (S102). The description of the behavioral operations is then converted into the HDL (Hardware Description Language) at the RT (Register Transfer) level by a behavior synthesis tool (S103). A logic synthesis tool converts the HDL into a net list at a gate level (S104). A layout tool receives the net list, and produces a mask pattern (S105). Using the mask pattern, exposure for producing an IC is carried out.

Further, in recent years, ICs have come to incorporate a CPU that is a master, a hardware circuit which is a slave, and an interface circuit between the master and the slave.

In these ICs, it is often the case that the interface circuit may send a command from the master CPU to the slave hardware circuit in a real-time manner. However, in some cases alternatively, the interface circuit may include a memory (RAM) that serves as a buffer, or a memory element such as a register, and may temporarily store the command from the CPU to adjust the timing for transmitting the command.

The command from the master CPU may be temporarily written in the memory element, and may be then read out by the slave hardware circuit at timing different from the writing operation to the memory element. The data from the slave hardware circuit may be written in the memory element, and may then be read out by the master CPU.

Because the memory element is provided in the interface circuit between the master CPU and the slave hardware circuit, the slave hardware circuit does not have to receive the command from the master CPU in a real-time manner. The memory element can cause a time lag between the issue of the command from the master CPU and the reception of the command by the slave hardware circuit, depending on circumstances.

In the above-mentioned steps S102 and S103 of describing the behavioral operations, synthesizing the behavioral operations, and outputting the result of the synthesization, an behavior synthesis tool automatically synthesizes an IC circuit from the description of the behavioral operations in a general programming language, e.g., the C language, and outputs data in a specified hardware description language.

The behavior synthesis tool realizes the entire sequence of the described behavioral operations in a single hardware circuit, but cannot assign the behavioral operations to CPU task software and to the hardware circuit. To develop a system in which a CPU (that is, software) and hardware cooperate, e.g., a single IC which incorporates the master CPU and the slave hardware circuit, or a system on a board on which the master CPU and the slave hardware circuit are provided as separate ICs, it is necessary to manually describe in the HDL at the RT level an interface circuit between the master CPU and the slave hardware circuit, which is labor-consuming work.

When developing an IC, various models of assignment of the behavioral operations to the slave hardware circuit and the master CPU are tested by comparing and estimating the processing times of the respective models. There is the problem that the sufficient number of the models of assignment cannot be tested. Further, when the specification of a system at an upper level is changed, the IC cannot be immediately coordinated. Therefore, the development of an IC takes a lot of time.

BRIEF SUMMARY OF THE INVENTION

It is therefore an object of the present invention to provide a system synthesizer, a method for synthesizing a system, and a storage medium containing a computer program for synthesizing a system, which can produce synthesized behavioral operations of an interface circuit without describing the interface circuit at the RT level when developing an IC or a system on board containing a master CPU, a slave hardware circuit, and the interface circuit between the master and the slave.

In a first aspect of the present invention, the system synthesizer is provided for synthesizing a system from a system description, the system description containing a permanent connection statement describing an access from a first circuit to a memory element in an interface circuit, and a behavioral sequential operation statement describing the operation of a second circuit which contains an access from the second circuit to the memory element in the interface circuit. The system synthesizer comprises: a separator for separating the permanent connection statement from the behavioral sequential operation statement; a determining processing unit for determining whether a variable in the system description is an interface variable indicating the memory element in the interface circuit; an interface circuit synthesizer for synthesizing the interface circuit from the permanent connection statement separated by the separator; a behavior synthesizer for synthesizing a sequential operation circuit from the behavioral sequential operation statement separated by the separator; a merging processing unit for merging the interface circuit with the sequential operation circuit via the memory element indicated by the interface variable; and a mergence result output device for outputting the system produced by the merging processing unit in a hardware description language.

Because the system description contains the description of the interface circuit between a master and a slave, the present invention eliminates the description of the interface circuit at RT level. Accordingly, the present invention easily produces the system that contains the interface circuit between the master and the slave, a CPU that is the master and a hardware circuit that is the slave.

Thus, when estimating assignment of behavioral operations to hardware and software, a number of models of assignment can be tested. Further, when the specification of the upper level system is changed, the system can be immediately coordinated.

In a second aspect of the present invention, the separator separates the system description into the permanent connection statements and the behavioral sequential operation statements, based on the presence or absence of a specified sign in the respective statements.

In a third aspect of the present invention, the determining processing unit determines a variable, which is contained in both the permanent connection statements and the sequential statements, as the interface variable.

In a fourth aspect of the present invention, the behavior synthesizer allows the variable, which was determined as the interface variable by the determining processing unit, to exclusively use one memory element.

In a fifth aspect of the present invention, the system synthesizer further comprises an interface constraints priority information storage device for storing a priority of the first circuit or the second circuit to write data in the memory element. The merging processing unit merges the interface circuit with the sequential operation circuit so that data is written in the memory element according to the priority.

In a sixth aspect of the present invention, a clock to be supplied to the memory element is specified, based on the clocks for driving the first circuit and the second circuit.

In a seventh aspect of the present invention, the permanent connection statements describe an access between a bus of a CPU in the system and the interface circuit.

An eighth aspect of the present invention relates to a method for synthesizing a system from a system description, the system description containing a permanent connection statement describing an access from a first circuit to a memory element in an interface circuit, and a behavioral sequential operation statement describing the operation of a second circuit which contains an access from the second circuit to the memory element in the interface circuit. The method comprises the steps of: separating the permanent connection statement from the behavioral sequential operation statement; determining whether a variable in the system description is an interface variable indicating the memory element in the interface circuit; synthesizing the interface circuit from the separated permanent connection statement; synthesizing a sequential operation circuit from the separated behavioral sequential operation statement; merging the interface circuit with the sequential operation circuit via the memory element indicated by the interface variable; and outputting the system produced by the merging processing unit in a hardware description language.

A ninth aspect of the present invention relates to a computer-readable medium containing program instructions for synthesizing a system from a system description, the system description containing a permanent connection statement describing an access from a first circuit to a memory element in an interface circuit, and a behavioral sequential operation statement describing the operation of a second circuit which contains an access from the second circuit to the memory element in the interface circuit. The program instructions including instructions for performing the steps comprising: separating the permanent connection statement from the behavioral sequential operation statement; determining whether a variable in the system description is an interface variable indicating the memory element in the interface circuit; synthesizing the interface circuit from the separated permanent connection statement; synthesizing a sequential operation circuit from the separated behavioral sequential operation statement; merging the interface circuit with the sequential operation circuit via the memory element indicated by the interface variable; and outputting the system produced by the merging processing unit in a hardware description language.

The present invention produces the interface circuit that can receive input according to the priority, based on the interface constraints priority information outputted from the interface constraints priority information storage device.

The present invention produces the circuit for appropriately setting the clock used in the interface circuit, based on clock selecting constraints information outputted from a clock selecting constraints information storage device.

According to the present invention, when the permanent connection statements describe the access between the CPU bus and the interface circuit, the description of that access at the RT level is not required. Namely, the present invention easily produces the circuit, which contains a CPU, a CPU bus, and the interface circuit, from the system description.

BRIEF DESCRIPTION OF THE DRAWINGS

FIG. 2 is a block diagram showing the system synthesizer of the present invention.

FIG. 3 is a flowchart showing the outline of the operation of the system synthesizer of the present invention.

FIGS. 7A to 7B are diagrams showing clock declaration in a system description according to the present invention.

FIG. 8 is a diagram showing the system description containing the register according to the present invention.

FIG. 14 is a diagram showing the system description containing a memory (RAM) according to the present invention.

DETAILED DESCRIPTION OF THE INVENTION

Figure 1:
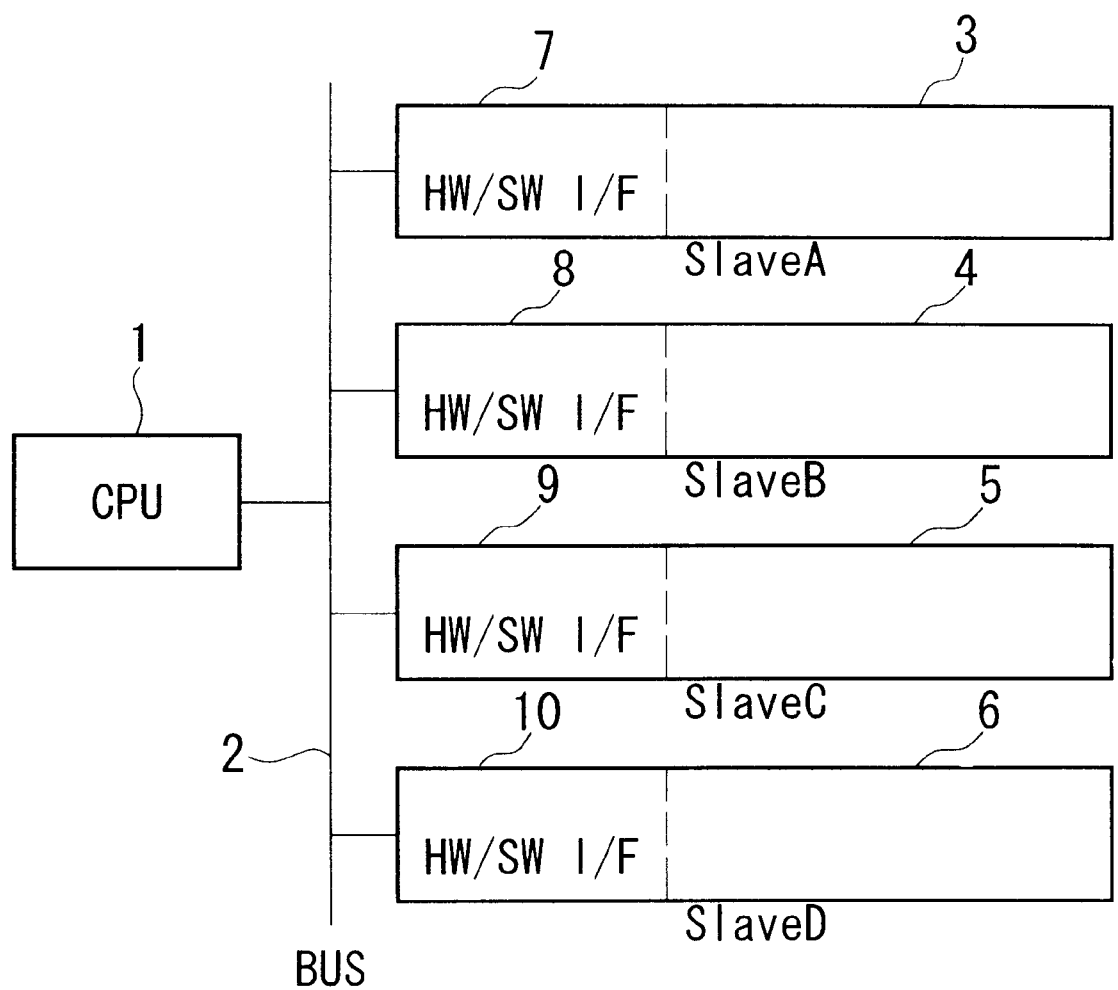
FIG. 1 is a block diagram showing the system designed by the system synthesizer of the present invention.

FIG. 1 shows an example of a system which comprises a CPU which is a master, hardware circuits which are slaves, and interface circuits between the master and the slaves which can be synthesized by the system synthesizer of the present invention. In this system, the master CPU 1 is connected to the slave circuits via a bus 2. The slave hardware circuits 3 to 6 are connected to the bus 2 via the interface circuits 7 to 10.

The interface circuits 7 to 10 have memory elements such as registers or small local memories. The registers or the small local memories are recognized as local registers or local memories by the slave hardware circuits, and are recognized as memories assigned to specified addresses in a global address space by the master CPU.

The interface circuits 7 to 10 confirm the writing operation by the CPU 1 at a specified timing. The reason for this is that the bus 2 connected to the master CPU 1 operates by a clock different from that for the slave hardware circuits.

The structure of data which describes the behavioral operations of the system, which is to be inputted to the system synthesizer of the present invention, will be explained with reference to FIG. 7 and FIG. 8. The description of the system comprises clock declaration shown in FIG. 7, and permanent connection statements and behavioral sequential operation statements shown in FIG. 8. The clock declaration may be contained in the description of the system shown in FIG. 8, or may be stored in the system synthesizer.

In the clock declaration shown in FIG. 7, the clock frequency used in the system is declared.

The behavioral sequential operation statements shown in FIG. 8 describe the behavior of a circuit that sequentially operates according to the clocks, that is, a circuit, which operates as an FSM (Finite State Machine). Since the behavioral sequential operation statements can describe an waiting operation to wait for clock edge, some registers are scheduled to be only at intended specified clock stages, while the other registers are to be accessed at the other clock stages. Therefore, in the description of the behavioral sequential operation statements, the operations writing to the memory elements such as registers are executed only in the limited clock stages.

The permanent connection statements shown in FIG. 8 describe the operations of the interface circuit, which is always waiting for the writing operation by the CPU. This writing operation to the interface circuit cannot be limited to a specified clock stage of the slave circuit. Therefore, the behavior synthesizer cannot schedule the writing operation to such a specified clock stage as behavioral sequential operation statements.

The system synthesizer of the present invention synthesizes the FSM from the behavioral sequential operation statements in the system description, and synthesizes the interface circuit, which cannot be managed by the FSM, from the permanent connection statements. Whenever the CPU executes the writing operation, the interface circuit can handle it.

The construction of the system synthesizer of the present invention will be explained with reference to FIG. 2. The system synthesizer comprises a processor 11, a hardware resource library 12, a constraints file 13, and an interface constraints priority storage device 14.

The processor 11 receives the system description as input, and outputs the circuit description at the RT level based on the input system description. The processor 11 is connected to the hardware resource library 12, the constraints file 13, and the interface constraints priority storage device 14, and receives information from these devices.

The hardware resource library 12 stores information regarding the types of hardware resources that are usable in the circuit to be synthesized by the system synthesizer. The stored information regards, for example, the bit width of usable adders, the areas and delays of operators, and the like.

The constraints file 13 stores the maximum usable number for each type of the hardware resources. At the scheduling process, the more the number for the type of hardware resource increases, the more copies of the same type of hardware resource the behavior synthesizer can utilize at the same time.

The interface constraints priority information storage device 14 stores the priority to access the interface circuit in the circuit to be synthesized. For example, the priority regards which of the CPU bus and the hardware circuits have a higher priority when they access the interface circuit at the same time.

The hardware resource library 12, the constraints file 13, and the interface constraints priority information storage device 14 may be provided as a hard disc drive, an magneto-optical disc drive, a non-volatile memory such as a flash memory, a read-only-storage medium such as a CD-ROM, a volatile memory such as a RAM (Random Access Memory), or a combination of these devices.

The processor 11 comprises an input device 15, a storage device 16, a separator 30, a determining processing unit 31, a behavior synthesizer 17, an interface circuit synthesizer 18, a merging processing unit 19, and a mergence result output device 20.

The input device 15 receives as input the system description and information outputted from the hardware resource library 12, the constraints file 13, and the interface constraints priority information storage device 14. The storage device 16 stores the system description and the information inputted to the input device 15, and the results of processes carried out in the processor 11.

The separator 30 separates the statements in the system description into the permanent connection statements and the behavioral sequential operation statements. The determining processing unit 31 determines whether variables in the system description are interface variables indicating the memory elements in the interface circuit.

The behavior synthesizer 17 synthesizes the sequential operation circuit from the behavioral sequential operation statements separated by the separator 30. The interface circuit synthesizer 18 synthesizes the interface circuit from the permanent connection statements separated by the separator 30.

The merging processing unit 19 merges the sequential operation circuit, which was synthesized by the behavior synthesizer 17, with the interface circuit that was synthesized by the interface circuit synthesizer 18. The mergence output device 20 outputs the mergence result produced by the merging processing unit 19. The output is the circuit description at the RT level that contains the slave hardware circuit, and the interface circuit between the master and the slave, which are connected to the master CPU containing software.

The processor 11 may be provided by dedicated hardware. The processor 11 may have a memory and CPU (Central Processing Unit), may load a computer program for providing the functions of the processor 11 to the memory, and may execute the functions. In this case, the separator 30, the determining processing unit 31, the behavior synthesizer 17, the interface circuit synthesizer 18, and the merging processing unit 19 of the processor 11 are provided by the computer program.

The processor 11 is connected to peripheral devices such as input devices and a display device, (which are not shown). The input devices are a keyboard, and a mouse. The display device is a CRT (Cathode Ray Tube), or a liquid crystal display device.

The outline of the operation of the processor 11 will be explained with reference to FIG. 3. A user manually inputs the system description that contains the clock declaration, the behavioral sequential operation statements, and the permanent connection statements, to the processor 11 using an editor. Then, in step 1, the input device 15 of the processor 11 reads the input system description, and stores it in the storage device 16.

In step 2, the input device 15 reads information from the hardware resource library 12, and stores it in the storage device 16. In step 3, the input device 15 reads information from the constraints file 13, and stores it in the storage device 16.

In step 4, the separator 30 separates the statements in the system description, which is stored in the storage device 16, into the behavioral sequential operation statements and the permanent connection statements, and stores the results in the storage device 16. Then, the determining processing unit 31 determines whether each variable in the behavioral sequential operation statements and the permanent connection statements, which are stored in the storage device 16, is the interface variable indicating the memory elements in the interface circuit, and stores the determined results in the storage device 16.

Subsequently, the behavior synthesizer 17 synthesizes the sequential operation circuit from the behavioral sequential operation statements stored in the storage device 16. The sequential operation circuit is the slave hardware circuit. In the synthesization step, the behavior synthesizer 17 refers to the information that is sent from the hardware resource library 12 and from the constraints file 13 and is stored in the storage device 16.

In step 5, the input device 15 reads information regarding the interface constraints priority from the interface constraints priority information storage device 14, and stores it in the storage device 16.

In step 6, the permanent connection circuit synthesizer 18 synthesizes the interface circuit, which contains an address decoder and the like, from the permanent connection statements stored in the storage device 16. Next, the merging processing unit 19 merges the synthesized interface circuit with the sequential operation circuit, and stores the results in the storage device 16.

In case the interface circuit requires a memory element and the data-writing lines into the memory element must be merged, a multiplexer (MUX) is inserted to set priorities for the data-writing lines. When different types of clocks are used and they must be merged, a clock selector may be inserted. But when only one of the permanent connection statement part and the behavioral sequential operation statement part performs the writing operation to the memory element, the writing operation need not be merged.

In step 7, the mergence result output device 20 outputs the result of the mergence, that is, the circuit description at the RT level, which contains the slave hardware circuit, the master CPU containing software, and the interface circuit between the master and the slave, written in HDL such as VHDL, and verilogHDL.

Figure 4:
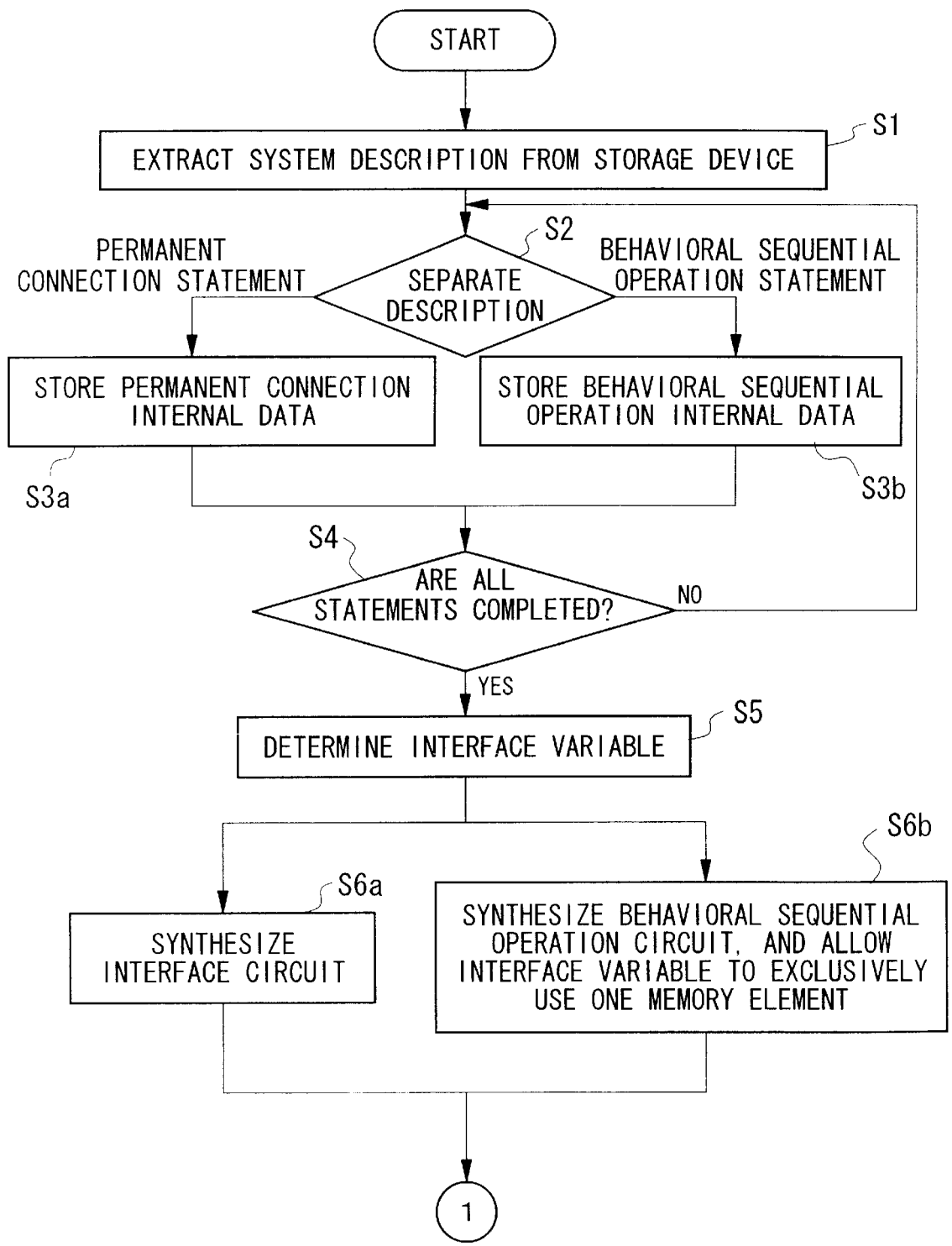
FIG. 4 is a flowchart showing in details the separation and mergence by the system synthesizer of the present invention.
Figure 5:
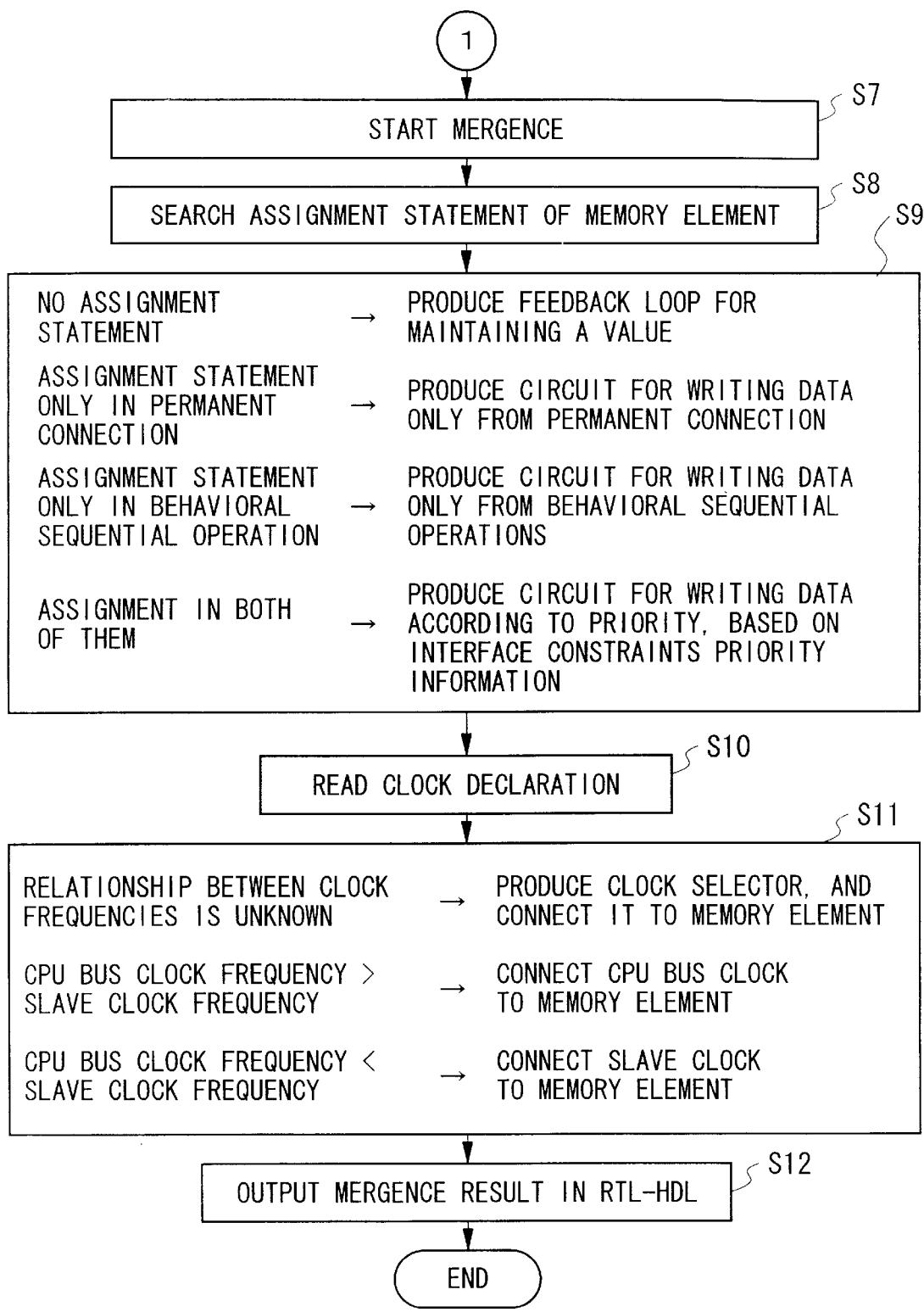
FIG. 5 is a flowchart showing in details the separation and mergence by the system synthesizer of the present invention.

The detail of the synthesization and mergence in steps 4 and 6 will be explained with reference to the flowcharts of FIGS. 4 and 5. FIGS. 4 and 5 are the continuous flowcharts in which "①" in FIG. 4 continues to "①" in FIG. 5. Reference characters such as "S1" denote steps in the flowcharts.

The separator 30 extracts one statement from the system description that contains the clock declaration, the permanent connection statements, and the behavioral sequential operation statements (step S1).

Next, the separator 30 determines whether the extracted statement is a permanent connection statement, or a behavioral sequential operation statement (step S2). The determination is made depending on the presence or absence of symbol "::=" which indicates the permanent connection statement. When "::=" is found in the statement, the separator 30 determines that the statement is a permanent connection statement. When "::=" is not found in the statement, the separator 30 determines that the statement is a behavioral sequential operation statement. The symbol "::=" means sending data from the bus of the master CPU to the memory element, such as the register, or the memory (RAM), in the interface circuit, and means reading the data from the memory element to the CPU bus.

The storage device 16 stores the separated permanent connection statements as permanent connection internal data (step S3a), and stores the separated behavioral sequential operation statements as sequential operation internal data (step S3b). The storage device 16 stores the declarations regarding the register and the memory (RAM) in both the permanent connection internal data and the sequential operation internal data.

Next, the separator 30 determines whether the separation of all the statements in the system description are finished (step S4). When the separation is not finished the flow returns to step S2 and the separator 30 separates the next statement. When the separation is finished, the flow proceeds to step S5. Thus, the separator 30 and the storage device 16 execute steps S2, S3a, and S3b for all the statements in the system description, and when the separation of all the statements is completed, the flow proceeds to step S5.

In step S5, the determining processing unit determines whether a variable at the left hand side of an assignment statement is an interface variable. When the same variable appears for read or write operation in both the permanent connection statement part and the behavioral sequential statement part, the variable is determined as the interface variable.

Next, the permanent connection circuit synthesizer 18 synthesizes the interface circuit (step S6a). The behavior synthesizer 17 synthesizes the sequential operation circuit (slave circuit) (step S6b). The variable which was determined as the interface variable in step S5 does not share a memory element with other variables, and exclusively uses one memory element (a register, or a memory (RAM)).

In general, behavior synthesizer 18 considers the life time of a variable. For example, a register is initially used to store a variable "a", and may be then used to store a variable "b" when the variable "a" is no longer valid. However, in the present invention, the interface variable is not handled in this manner, but uses one register exclusively in the synthesized circuit.

Referring to FIG. 5, the merging processing unit 19 starts merging (step S7). Next, the merging processing unit 19 investigates conditions of writing operation (assignment statement) into the interface memory element (such as a register, or a RAM) in the permanent connection statements and the behavioral sequential operation statements (step S8). The investigation of the writing operation conditions means to check when the writing operation into the interface circuit, which is referred to in both the permanent connection statement part and the behavioral sequential operation statement part, is executed.

Depending on the results of the investigation, the merging processing unit 19 performs the following operations (step S9). When no assignments to the interface memory element are contained either in the permanent connection statement part or the behavioral sequential operation part, the merging processing unit 19 produces a feedback loop in the interface circuit. When the assignment statement is contained only in the permanent connection statements, the merging processing unit 19 produces a circuit for writing a value only from the permanent connection statements. When the assignment statement is contained only in behavioral sequential operation statements, the merging processing unit 19 produces a circuit for writing a value only from the behavioral sequential operation statements. When the assignment statement is contained in both the permanent connection statements and the behavioral sequential operation statements, the merging processing unit 19 produces a circuit for writing a value in the memory element according to the priorities specified in the interface constraints priority information.

Next, the merging processing unit 19 reads the clock declaration that is described at the top of the system description stored in the storage device 16 (step S10). The clock declaration declares the clock frequency used in the circuit to be synthesized. According to the clock declaration, the merging processing unit 19 performs the following operations (step S11). When the relationship between the CPU bus clock and the slave clock is not fixed, the merging processing unit 19 produces a clock selector, and connects the clock selector to the memory element (such as a register, or a memory (RAM)) in the interface circuit. Further, the clock selector is connected to a control line for controlling the selecting. When the frequency of the CPU bus clock is above the frequency of the slave clock, the merging processing unit 19 connects the CPU bus clock to the memory element (such as a register) in the interface circuit. When the frequency of the CPU bus clock is below the frequency of the slave clock, the merging processing unit 19 connects the slave clock to the memory element (such as a register) in the interface circuit. Then, the mergence result output device 20 outputs the results of mergence by the merging processing unit 20 in HDL at the RT level (step S12).

Figure 6A:
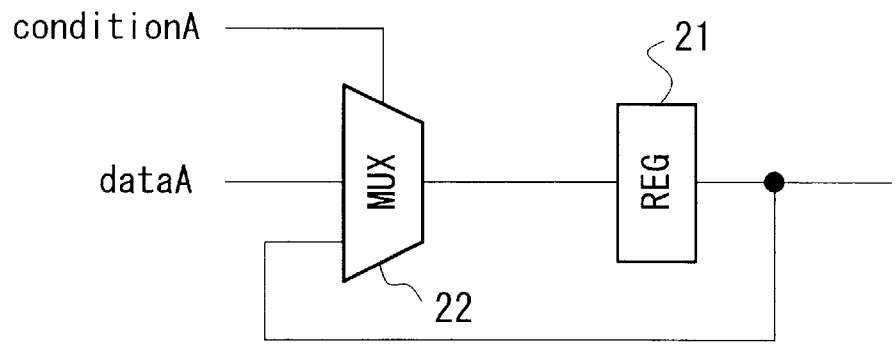
FIGS. 6A to 6C are block diagrams showing the circuit for writing data in a register according to a priority according to the present invention.

The circuit for writing data according to the priorities in step S9 will be discussed with reference to FIGS. 6A to 6C. FIG. 6A shows the example of the interface circuit which is synthesized under the conditions of "sometimes being assigned to only in the permanent connection statement part and sometimes being not assigned to either in the permanent connection statement part or in the behavioral sequential statement part". When the condition A is met, data A is written in a register 21. That is, when the condition A is true, a multiplexer 22 selects the data A, and the selected data A is written in the register 21. When the condition is false, the multiplexer 22 selects the output from the register 21, and the selected output from the register 21 is inputted to the same register 21. Accordingly, the register 21 maintains the previously stored value.

Figure 6B:
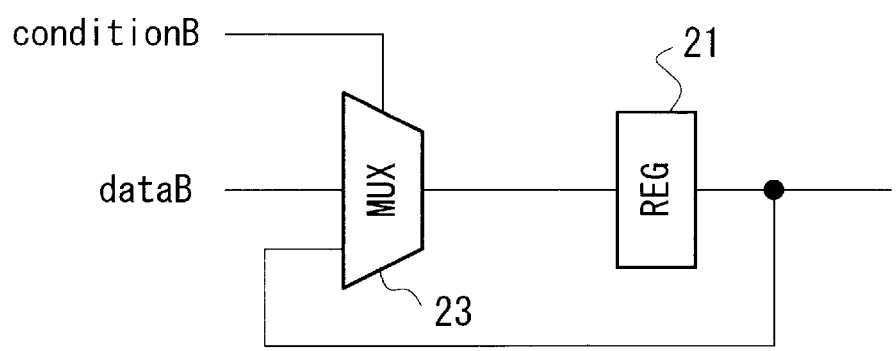

FIG. 6B shows the example of the interface circuit that is synthesized under the conditions of "sometimes being assigned to only in the behavioral sequential operation statement part, and sometimes being not assigned to either in the permanent connection statement part or in the behavioral sequential statement part". When the condition B is met, data B is written in the register 21. That is, when the condition B is true, a multiplexer 23 selects the data B, and the selected data B is written in the register 21. When the condition is false, the multiplexer 23 selects the output from the register 21, and the selected output from the register 21 is inputted to the same register 21. Accordingly, the register 21 maintains the previously stored value.

Figure 6C:
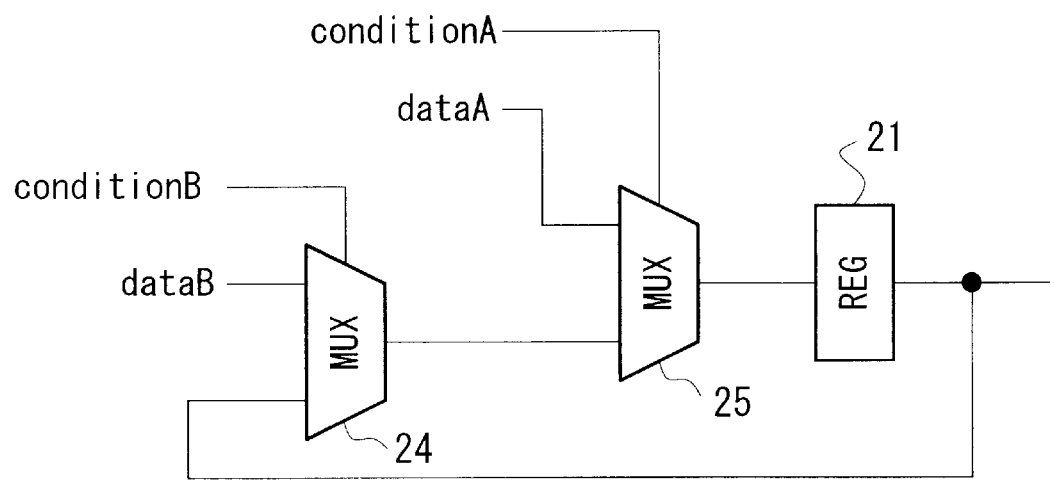

By merging the circuit of FIG. 6A with the circuit of FIG. 6B under the condition that the condition A has a priority over the condition B, the circuit shown in FIG. 6C is produced. The circuit is synthesized under the condition of "sometimes being assigned to both in the permanent connection statement part and the behavioral sequential operation statement part, and sometimes being not assigned to either in the permanent connection statement part or in the behavioral sequential statement part". When the condition A is true, a multiplexer 25 selects the data A, the selected data A is written in the register 21 according to the priority. When the condition A is false, the condition B is then checked, and, when the condition B is true, a multiplexer 24 selects the data B, and the selected B is written in the register 21. When both the conditions A and B are false, the register 21 maintains the previously stored value.

Referring to FIGS. 7A and 7B, the examples of the clock declaration in the system description will be explained. FIG. 7A shows the example of the declaration of the fixed frequencies of the slave clock and the CPU bus clock. In the example, the slave clock ("clock" in FIG. 7A) frequency is 100 MHz, and the CPU bus clock ("ext_clock" in FIG. 7A) is 66 MHz. Since the slave clock is higher, the slave clock is applied to the memory element in the interface circuit. When separating the system description into the permanent connection statements and the behavioral sequential operation statements, the declaration of the CPU bus clock is assigned to the permanent connection statements, and the declaration of the slave clock is assigned to the behavioral sequential operation statements.

FIG. 7B shows the example of the declaration of the frequencies of the slave clock and the CPU bus clock, which are not fixed. The frequency changes conditionally and dynamically. In the example, the slave clock ("clock" in FIG. 7B) frequency is 10 kHz, or 100 MHz, and the CPU bus clock ("ext_clock" in FIG. 7B) frequency is 33 MHz, or 66 MHz. In this case, a clock selector for selecting the clock for the memory element in the interface circuit, depending on a change in frequency, is produced.

The example of the process for synthesizing the circuit from the system descriptions shown in FIGS. 7A, 7B, and 8 according to the system synthesizer of the present invention will be explained. In the example, a register is used as the memory element in the interface circuit. The statements in FIGS. 7A and 7B are the clock declarations that declare the clock frequencies to be used in the system. The system description of FIG. 8 comprises the permanent connection statement portion 32 and the behavioral sequential operation statement portion 33. The address recognized by the CPU is indicated by a variable "address".

The permanent connection statement portion 32 describes that, in write mode, when the address is 0xFC00, write_data_from_bus is written in the register a_reg (32a), and that, in read mode, when the address is 0xFC00, the data stored in the register a_reg is read to read_data_to_bus. The writing and reading operations are expressed by assignment characters "::=". The writing and reading operations are not necessarily synchronized with the clock of the slave circuit, but are synchronized with the CPU bus clock, and executed while the condition of the address is met.

The behavioral sequential operation statement portion 33 describes the behavioral sequential operations that depend on the slave clock. The circuit waits for three clock edges (33a), and writes the value write_data_from_slave, which is sent from the slave, in the register a_reg in the interface circuit at the time of the third clock when the condition 1 is true (33b). Then, the circuit waits for four clock edges (33c). In the waiting time, if the CPU and the interface circuit communicate and the CPU writes a new value in the register a_reg, the value in the register a_reg is changed. In the next step, when the value in the register a_reg is 5, the circuit waits for three clock edges (33d). Further, the circuit waits for two clock edges (33e), and returns to the beginning of the process.

Figure 9:
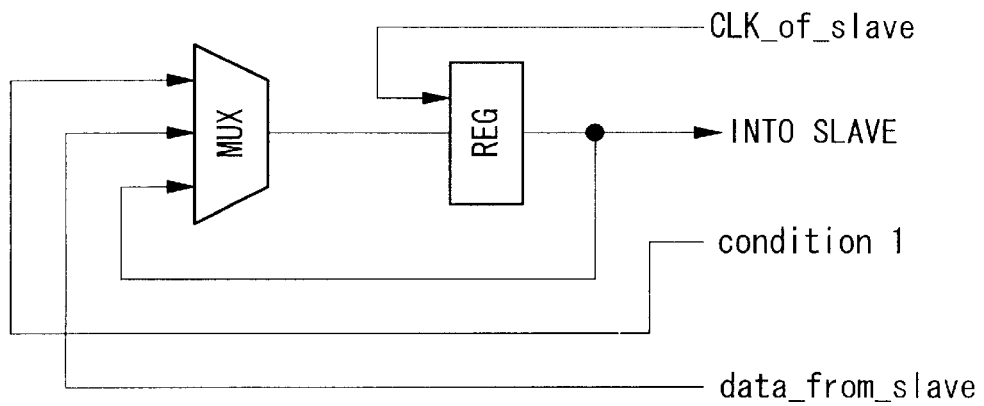
FIG. 9 is a block diagram showing the circuit synthesized from the behavioral sequential operation statements containing the register according to the present invention.

FIG. 9 shows the circuit synthesized by the behavior synthesizer 17 only from the behavioral sequential operation statement portion 33 in the system description shown in FIG. 8. The register (REG) in the circuit operates, depending only on the slave clock (CLK_of_slave). The input condition of the register (REG) is condition 1 that switches the multiplexer, and accordingly a value of data_from_slave or the output of the register (REG) itself is written into the register (REG).

Figure 10:
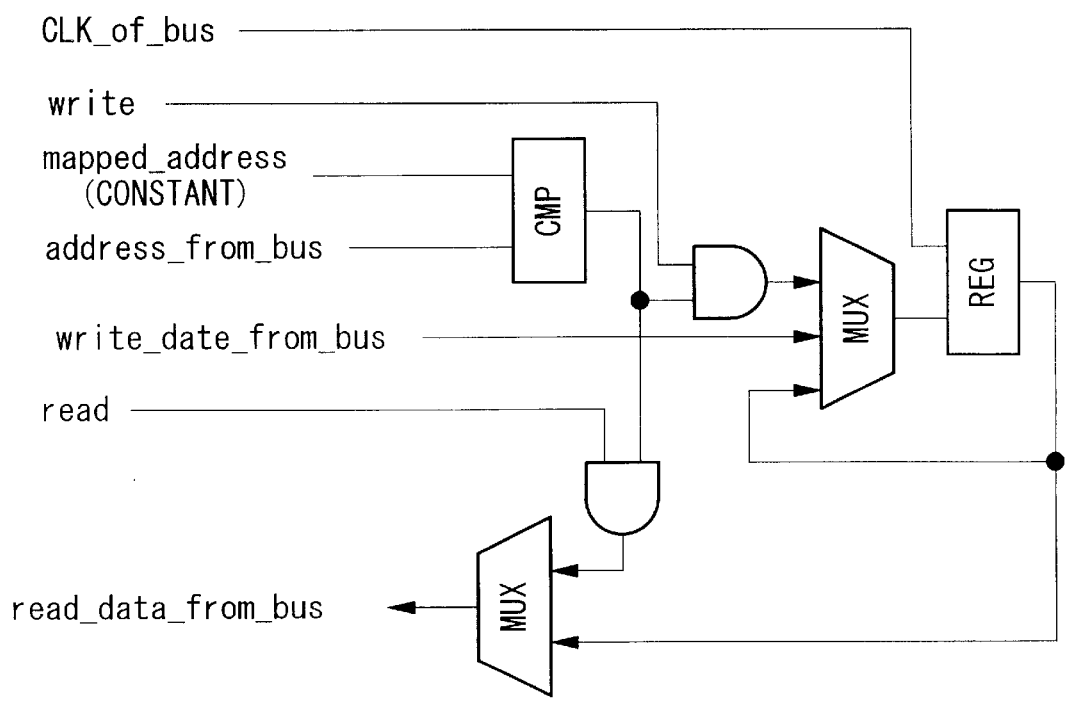
FIG. 10 is a block diagram showing the circuit synthesized from the permanent connection statements containing the register according to the present invention.

FIG. 10 shows the circuit synthesized by the interface circuit synthesizer 18 only from the permanent connection statement portion 32 in the system description shown in FIG. 8. The circuit handles only the access from the CPU bus. The register (REG) operates, depending on the CPU bus clock. The multiplexer for switching the input to the register (REG) is switched, depending on the address (address_from_bus) from the CPU bus. The register (REG) receives as input the data from the CPU bus (write_data_from_bus) or the output from the register (REG) itself, depending on the switching of the multiplexer (MUX) or the output from the register (REG) itself.

Figure 11:
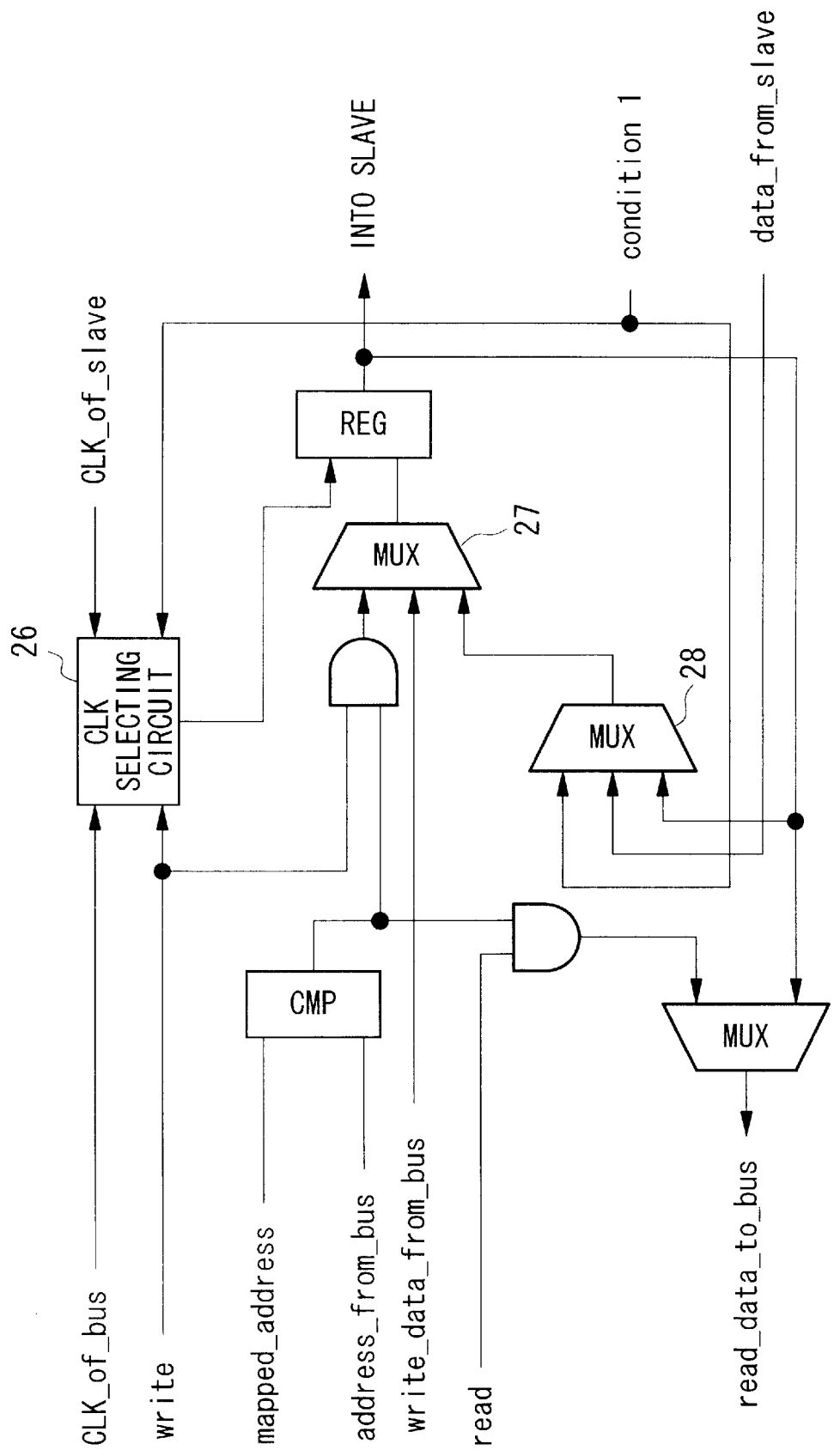
FIG. 11 is a block diagram showing the circuit which contains a clock selecting circuit, and which is produced by merging the circuit, synthesized from the behavioral sequential operation statements containing a register, with the circuit synthesized from the permanent connection statements according to the present invention.
Figure 12:
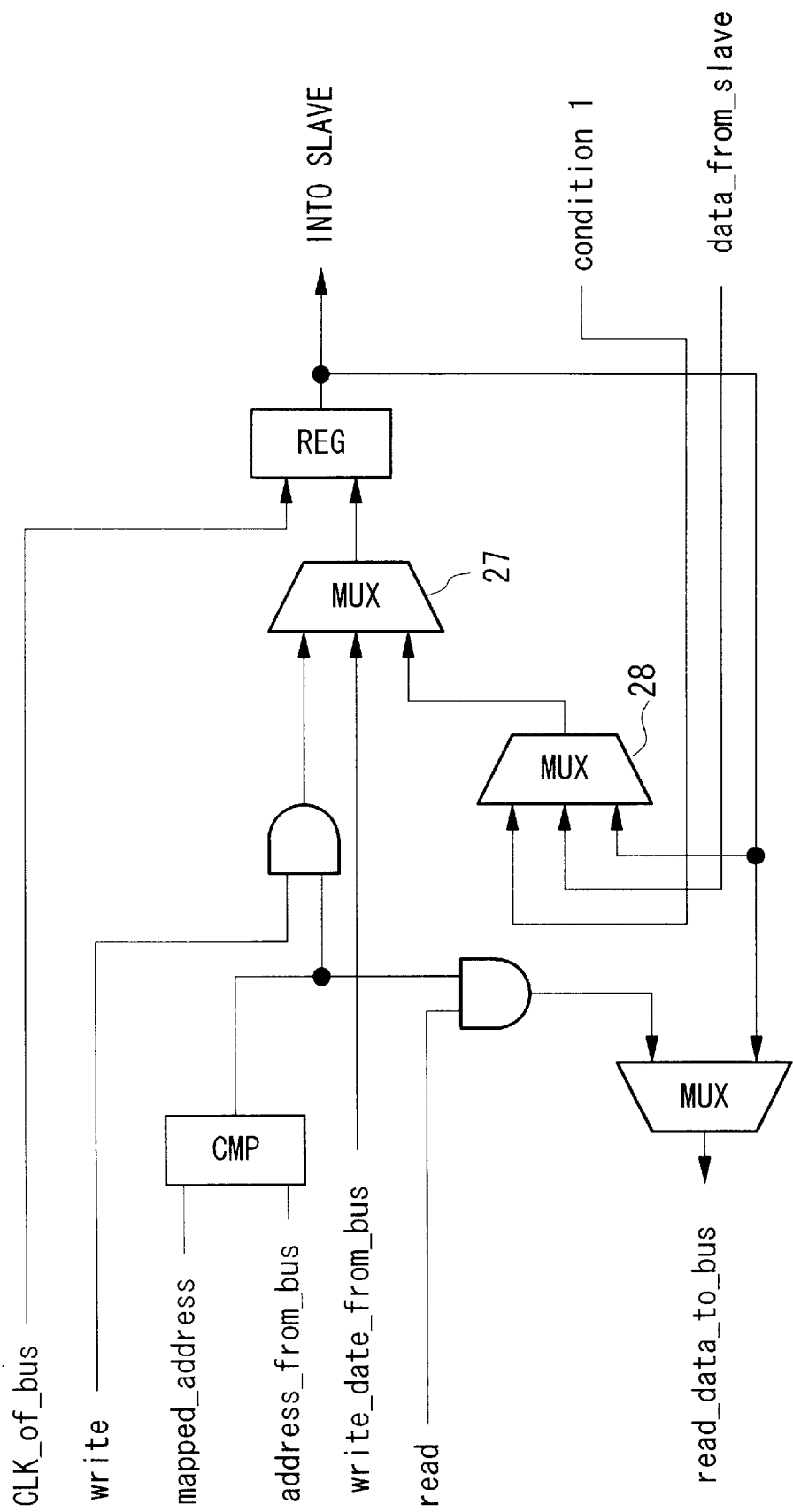
FIG. 12 is a block diagram showing the circuit which contains a register synchronized with the CPU bus clock, and which is produced by merging the circuit, synthesized from the behavioral sequential operation statements, with the circuit synthesized from the permanent connection statements according to the present invention.
Figure 13:
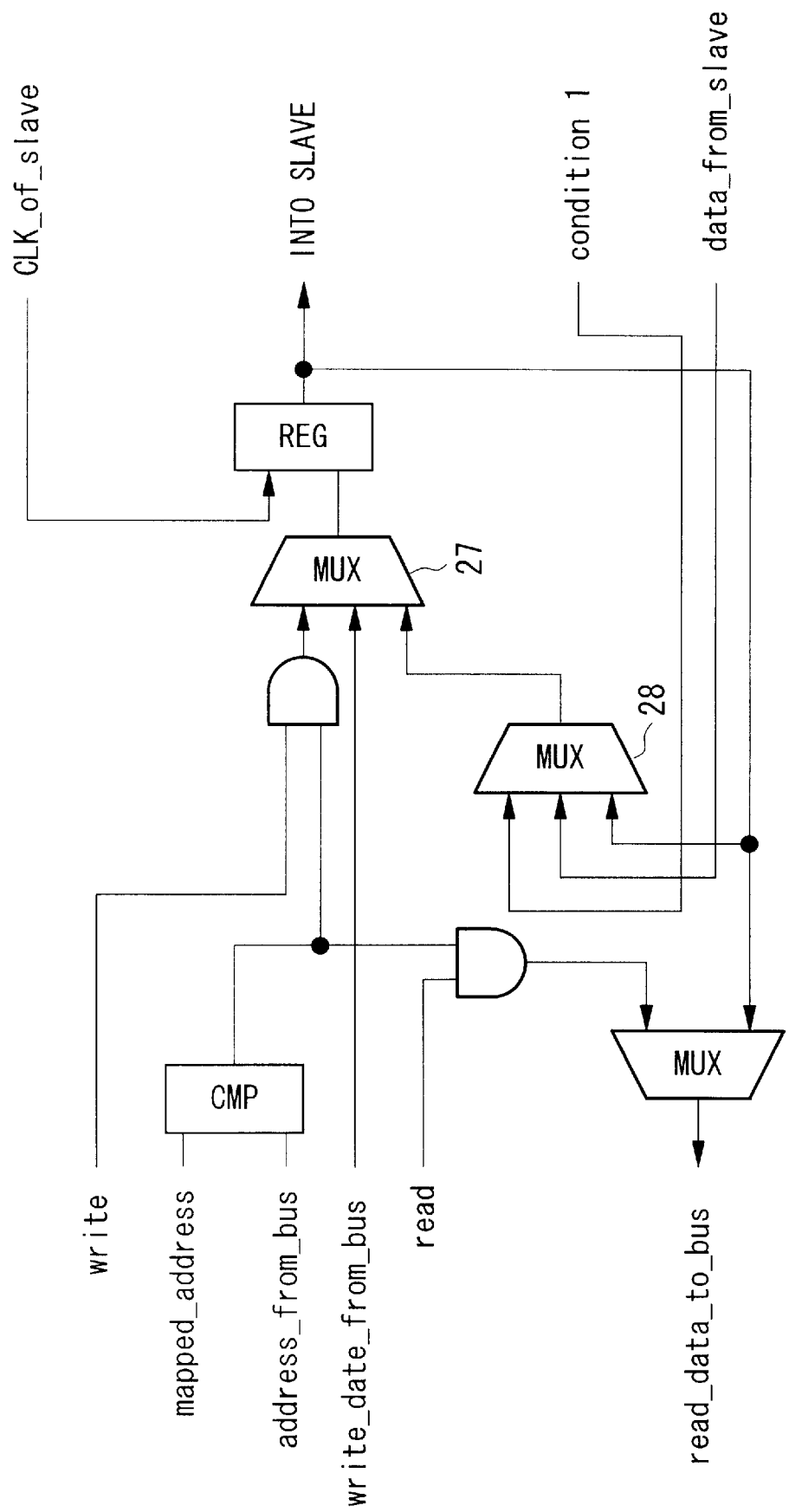
FIG. 13 is a block diagram showing the circuit which contains a register synchronized with the slave clock, and which is produced by merging the circuit, synthesized from the behavioral sequential operation statements, with the circuit synthesized from the permanent connection statements according to the present invention.

FIGS. 11 to 13 shows the circuit produced by the merging processing unit 19 from the circuits shown in FIGS. 9 and 10, depending on the condition for selecting the clock. FIG. 11 shows the example of the circuit that contains a CLK selecting circuit 26 for selecting the clock, which is synthesized by the merging processing unit 19. The CLK selecting circuit 26 selects either the clock of the CPU bus (CLK_of_bus) or of the slave (CLK_of_slave). The merging processing unit 19 automatically produces the CLK selecting circuit 26 when the frequencies of the clocks of the slave and of the CPU bus are changeable, and when the faster-or-slower relation between the two frequencies is not fixed.

Since a flip-flop is used as the register (REG), its stored value is updated whenever the clock trigger is inputted. If the element, which is fanin of input data of the register (REG), cancels the input data before the register (REG) receives the next clock edge, the value in the register (REG) is not updated. Therefore, the same clock must be selected and supplied to the register (REG) as of the subcircuit which is sending input data into the register (REG).

When the CPU is to write data in the register (REG), the clock of the CPU is selected as the clock supplied to the register (REG). When the slave is to write data in the register (REG), the clock of the slave is selected as the clock of the register (REG). The selection is performed by the CLK selecting circuit 26, depending on the "condition 1" and the signal "write" in FIG. 11.

The priority of the CPU or the slave, which is to write the data, is transferred, separately from the system description, to the controller 11 as the interface constraints priority information outputted from the interface constraints priority information storage device 14. It is determined, based on the information, which the CPU or the slave has the priority to write the data.

In FIG. 11, the write data from the CPU (write data_from bus) has the priority over the write data from the slave (data_from_slave). This function is provided by the arrangement of the multiplexers (MUXs) 27 and 28. To merge the write data lines for writing data in the memory element in the interface circuit, the multiplexers (MUXs) give the priority to the write data line. To merge the clock line, the CLK selecting circuit 26 is added.

The priority for writing the data may be inputted by a button as an execution option to the behavior synthesis tool.

FIG. 12 shows the example of the circuit using a register (REG) which is synchronized with the CPU bus clock (CLK_of_bus), synthesized by the merging processing unit 19. When the faster-or-slower relation between the CPU bus clock and the slave clock is fixed, and when the register (REG) is driven by the faster clock, the data can be written in the register (REG) without data loss. The example in FIG. 12 uses the CPU bus clock because the CPU bus clock is always faster.

FIG. 13 shows the example of the circuit using a register (REG) synchronized with the slave clock (CLK_of_slave). In the example, the slave clock (CLK_of_slave) is always faster than the CPU bus clock (CLK_of_bus).

The CLK selecting circuit 26, is an asynchronous circuit because it must select the clock. Since the timing control of this circuit is difficult, the CLK selecting circuit should be eliminated if possible. The circuits shown in FIGS. 12 and 13 do not have the CLK selecting circuit 26 because it is not necessary.

The process for synthesizing the circuit using a memory as a memory element in the interface circuit will be explained with reference to FIGS. 14 to 17.

The system description of FIG. 14 comprises a permanent connection statement portion 34 and a behavioral sequential operation statement portion 35. A global address, which is recognized by the CPU, is indicated by a variable "address", and a local address in the memory element is indicated by a variable "local_address". The local address is indicated by "address—offset" where "offset" is a constant offset and difference from global address.

The permanent connection statement portion 34 describes that, in write mode, when the address is 0xFC01-0xFC11, write_data_from_bus is written in the memory b_mem (34a), and that, in read mode, when the address is 0xFC01-0xFC11, the data stored in the memory b_mem is read out to a variable read_data_to_bus (34b).

The behavioral sequential operation statement portion 35 describes the sequential behavioral operations that depend on the clock. The circuit waits for three clock edges (35a), and writes the value write_data_from_slave, which is sent from the slave, in the memory b_mem in the interface circuit at the time of the third clock when the condition 1 is true (35b). Then, the circuit waits for two clock edges (35c). In the next step, when the value in the memory b_mem is 5, the circuit waits for one clock (35d). Further, the circuit waits for two clock edges (35e), and returns to the beginning of the process.

Figure 15:
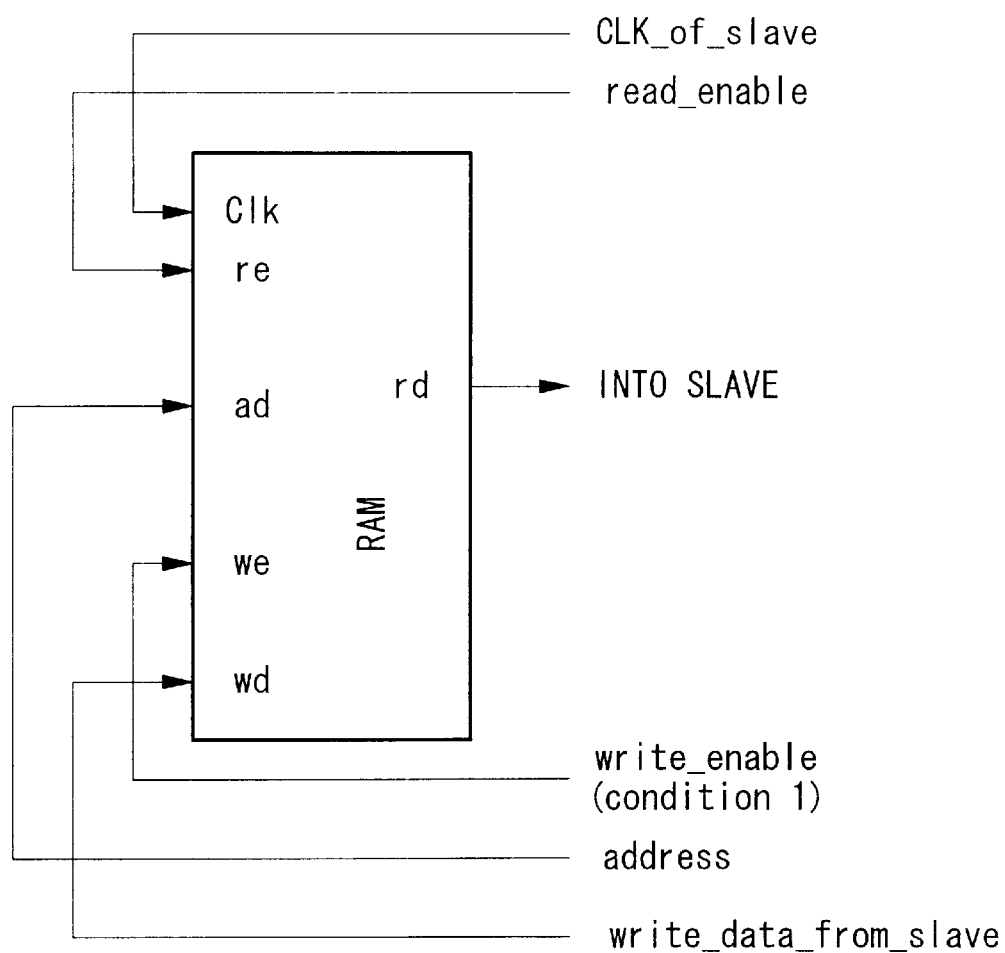
FIG. 15 is a diagram showing the circuit synthesized from the behavioral sequential operation statements containing the memory (RAM) according to the present invention.

FIG. 15 shows the circuit synthesized by the behavior synthesizer 17 only from the behavioral sequential operation statement portion 35 in the system description shown in FIG. 14. The memory (RAM) in the circuit operates, depending only on the slave clock (CLK_of_slave). The input condition of the memory (RAM) is write_enable (condition 1). A value from the slave (write_data_from_slave) is written in the memory (RAM).

Figure 16:
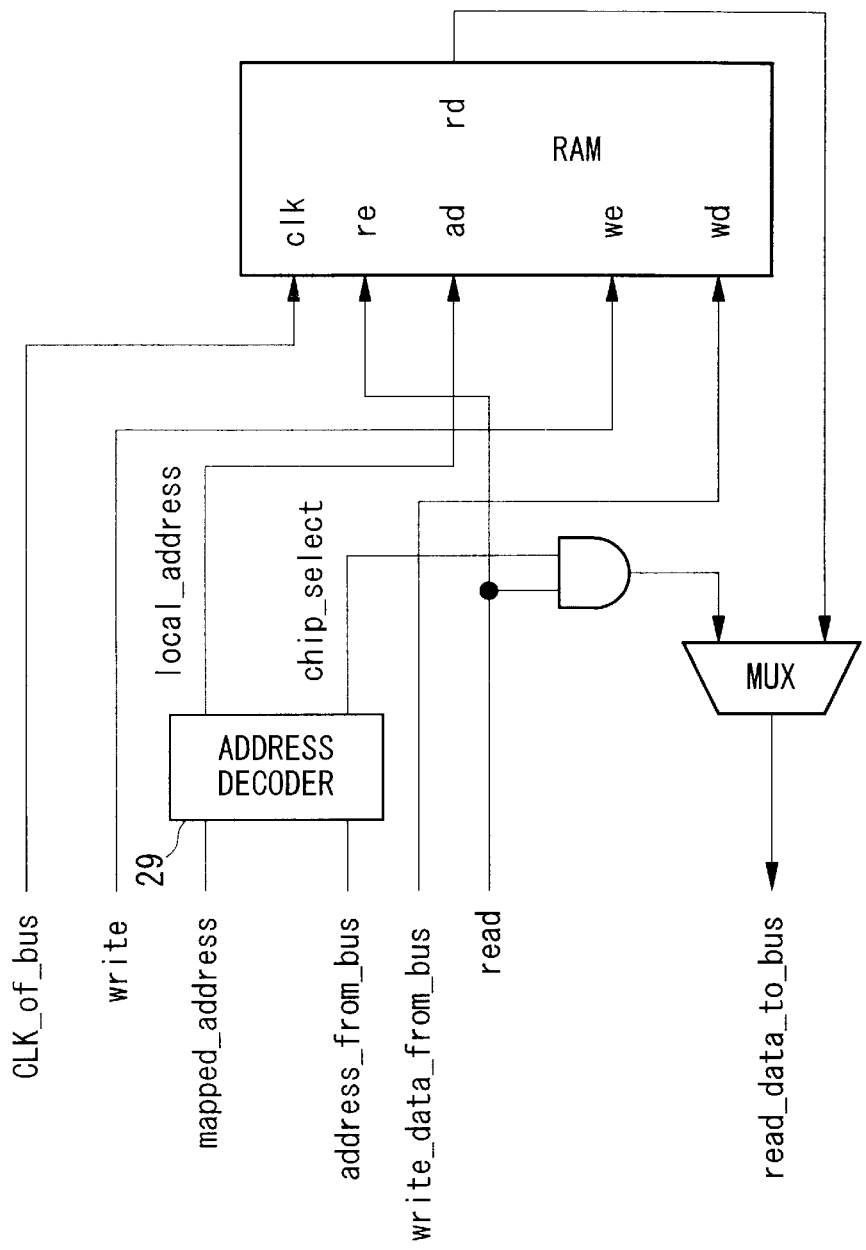
FIG. 16 is a diagram showing the circuit synthesized from the permanent connection statements containing the memory (RAM) according to the present invention.

FIG. 16 shows the circuit synthesized by the interface circuit synthesizer 18 only from the permanent connection statement portion in the system description of FIG. 14. The circuit handles only the access from the CPU bus. The memory (RAM) is driven by the CPU bus clock (CLK_of_bus). An address decoder 29 converts the global address, which is sent from the CPU bus, into the local address (local_address) in the memory (RAM).

Figure 17:
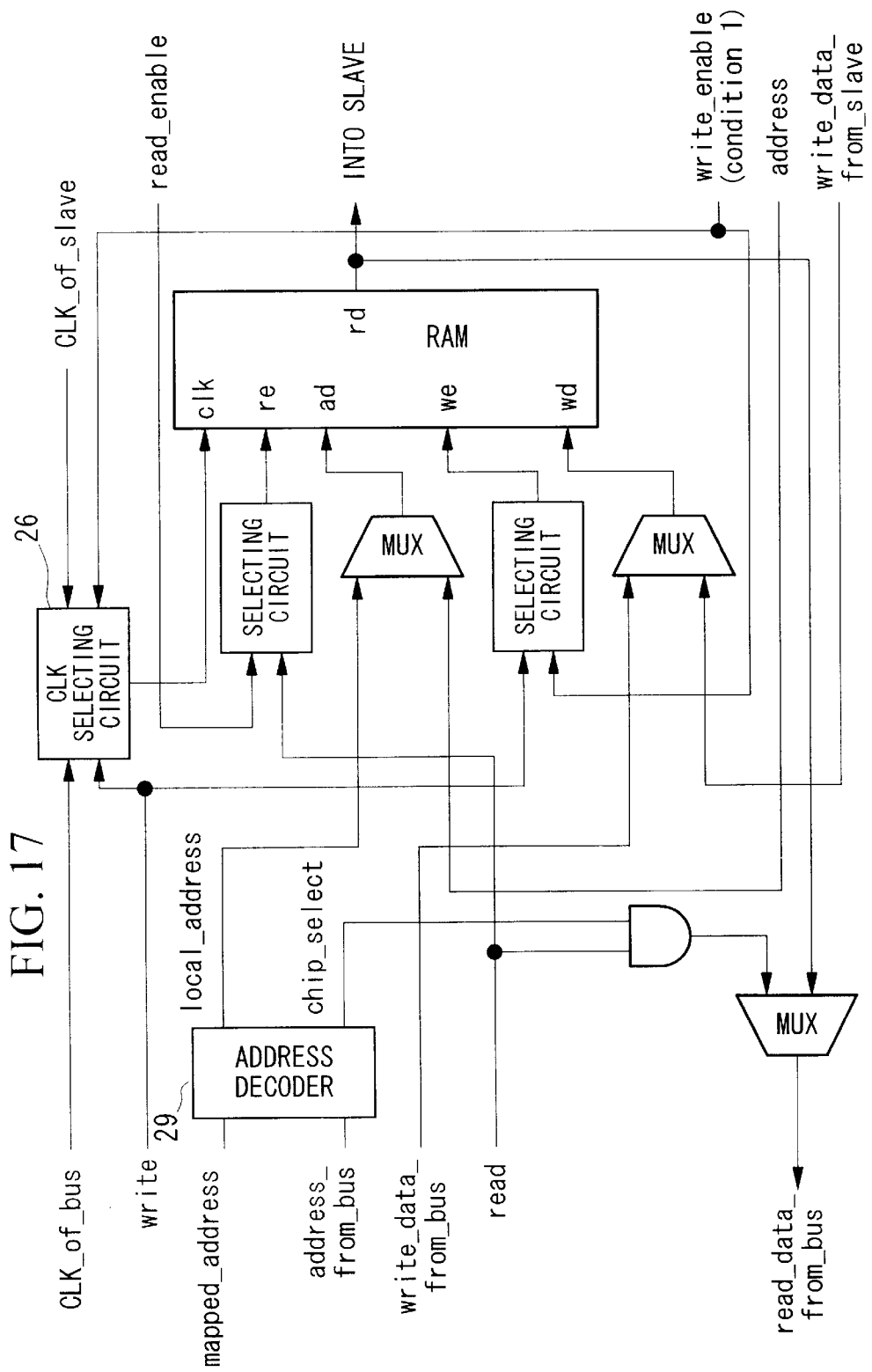
FIG. 17 is a diagram showing the circuit produced by merging the circuit, synthesized from the behavioral sequential operation statements, with the circuit synthesized from the permanent connection statements according to the present invention.
Figure 18:
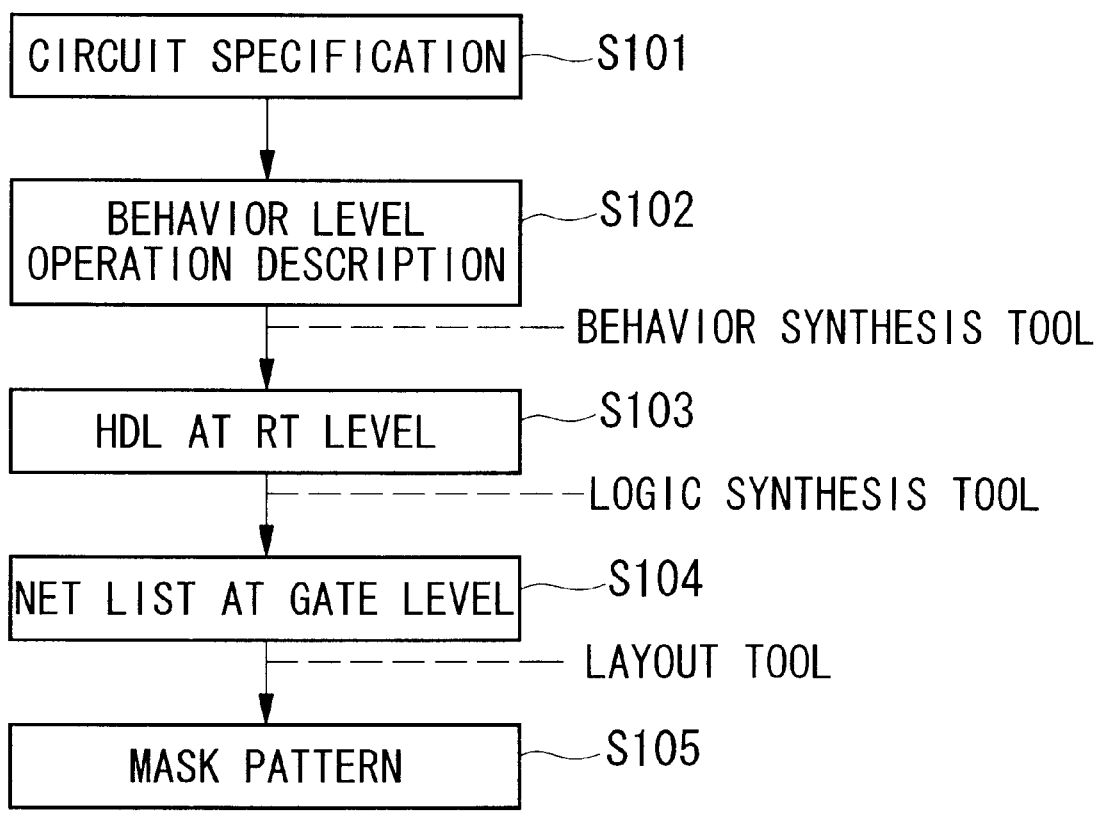
FIG. 18 a diagram showing a general process for developing an IC uses various tools such as a system synthesizer (behavior synthesis tool).

FIG. 17 shows the circuit produced by the merging processing unit 19 from the circuits shown in FIGS. 15 and 16. In FIG. 17, the merging processing unit 19 synthesizes the circuit that contains the CLK selecting circuit 26 for selecting the clock. The CLK selecting circuit 26 selects either the clock of the CPU bus (CLK_of_bus) or the clock of the slave (CLK_of_slave). The selection is performed, based on "write_enable" (condition 1) and "write" shown in FIG. 17.

In the present invention, the interface circuit synthesized from the permanent connection statements is not limited to the circuit connected to the CPU bus. For example, the present invention can be applied to inter-hardware communication between slaves that use different clocks in which there is no master CPU. In the inter-hardware communication, a priority for writing data in a memory element (such as a register, or a memory (RAM)) is determined, based on a handshake signal. In general, the operation of a portion (interface) for receiving an external signal may be described in the permanent connection statements, and the operation of a portion for processing the externally-inputted signal may be described in the behavioral sequential operation statements.

A computer program for providing the function of the processor 11 may be recorded in a computer-readable storage medium, the medium may be read by a computer system, and the computer system may execute the program. The computer system includes an OS and peripheral hardware devices. The computer system, when it uses a WWW system, includes a home-page providing circumstance (or a home-page display circumstance).

The computer-readable storage medium is a removable medium such as a floppy disc, a magneto-optical disc, a ROM, or a CD-ROM or storage devices such as a hard disc drive unit built in the computer system. The computer-readable storage medium includes a carrier medium or carrier waves which temporarily and dynamically stores the program, such as communication line, which is e.g., a network such as the Internet, or a telephone line, for transmitting the program, and includes a device which stores the program for a predetermined time of period, such as a volatile memory in a computer system which serves as a server or a client.

The computer program may provide only a part of the above-described function. Further, the above-described function may be provided by a combination of the program that has been stored in the computer program with another different file (different program).

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A system synthesizer for synthesizing a system from a system description, the system description containing a permanent connection statement describing an access from a first circuit to a memory element in an interface circuit, and a behavioral sequential operation statement describing the operation of a second circuit having access to the memory element in the interface circuit, the system synthesizer comprising:

a separator for separating the permanent connection statement from the behavioral sequential operation statement;

a determining processing unit for determining whether a variable in the system description is an interface variable indicating the memory element in the interface circuit;

an interface circuit synthesizer for synthesizing the interface circuit from the permanent connection statement separated by the separator;

a behavior synthesizer for synthesizing a sequential operation circuit from the behavioral sequential operation statement separated by the separator;

a merging processing unit for merging the interface circuit with the sequential operation circuit via the memory element indicated by the interface variable; and a result output device for outputting the system produced by the merging processing unit in a hardware description language.

2. A system synthesizer according to claim 1, wherein the separator separates the system description into the permanent connection statements and the behavioral sequential operation statements, based on the presence or absence of a specified sign in the respective statements.

3. A system synthesizer according to claim 1, wherein the determining processing unit determines a variable, which is contained in both the permanent connection statements and the sequential statements, as the interface variable.

4. A system synthesizer according to claim 1, wherein the behavior synthesizer allows the variable, which was determined as the interface variable by the determining processing unit, to be exclusively assigned to one memory element.

5. A system synthesizer according to claim 1, further comprising an interface constraints priority information storage device for storing a priority of the first circuit or the second circuit to write data in the memory element, wherein
the merging processing unit merges the interface circuit with the sequential operation circuit so that data is written in the memory element according to the priority.

6. A system synthesizer according to claim 1, wherein a clock to be supplied to the memory element is specified, based on the information related to clocks for driving the first circuit and the second circuit.

7. A system synthesizer according to claim 1, wherein the permanent connection statements describe an access between a bus of a CPU in the system and the interface circuit.

8. A method for synthesizing a system from a system description, the system description containing a permanent connection statement describing an access from a first circuit to a memory element in an interface circuit, and a behavioral sequential operation statement describing the operation of a second circuit having an access to the memory element in the interface circuit, the method comprising the steps of:

separating the permanent connection statement from the behavioral sequential operation statement;

determining whether a variable in the system description is an interface variable indicating the memory element in the interface circuit;

synthesizing the interface circuit from the separated permanent connection statement;

synthesizing a sequential operation circuit from the separated behavioral sequential operation statement;

producing the system by merging the interface circuit with the sequential operation circuit via the memory element indicated by the interface variable; and outputting the system produced by the merging processing unit in a hardware description language.

9. A computer-readable medium containing program instructions for synthesizing a system from a system description, the system description containing a permanent connection statement describing an access from a first circuit to a memory element in an interface circuit, and a behavioral sequential operation statement describing the operation of a second circuit having access to the memory element in the interface circuit, the program instructions including instructions for performing the steps comprising:

separating the permanent connection statement from the behavioral sequential operation statement;

determining whether a variable in the system description is an interface variable indicating the memory element in the interface circuit;

synthesizing the interface circuit from the separated permanent connection statement;

synthesizing a sequential operation circuit from the separated behavioral sequential operation statement;

producing the system by merging the interface circuit with the sequential operation circuit via the memory element indicated by the interface variable; and outputting the system produced by the merging processing unit in a hardware description language.

* * * * *